United States Patent [19]

Nagano et al.

[11] Patent Number: 5,455,116
[45] Date of Patent: * Oct. 3, 1995

[54] ELECTROMAGNETIC WAVE REFLECTION-PREVENTING MATERIAL AND ELECTROMAGNETIC WAVE REFLECTION-PREVENTING METHOD

[75] Inventors: Toshiaki Nagano; Hideo Kogure; Tetsu Maki; Naozumi Iwasawa, all of Hiratsuka, Japan

[73] Assignee: Kansai Paint Co., Ltd., Amagasaki, Japan

[*] Notice: The portion of the term of this patent subsequent to Sep. 26, 2012 has been disclaimed.

[21] Appl. No.: 140,556

[22] Filed: Oct. 25, 1993

[30] Foreign Application Priority Data

Oct. 27, 1992 [JP] Japan .................................. 4-310765
Jan. 22, 1993 [JP] Japan .................................. 5-027355

[51] Int. Cl.$^6$ .................................................. B32B 9/00
[52] U.S. Cl. ........................... 428/545; 428/546; 428/549; 174/35 C; 174/35 R; 174/35 MS
[58] Field of Search ..................... 428/545, 546, 428/549; 174/35 C, 35 R, 35 MS

[56] References Cited

FOREIGN PATENT DOCUMENTS 241098  2/1990  Japan .

*Primary Examiner*—Patrick J. Ryan
*Assistant Examiner*—Kam F. Lee
*Attorney, Agent, or Firm*—Fisher, Christen & Sabol

[57] ABSTRACT

An electromagnetic wave reflection-preventing material having a structure formed by successively laminating (A) an electromagnetic wave reflecting material layer, if needed, (B) a supporting layer, (C) a resin layer, if needed, (D) a supporting layer, and (E) a metallic pattern layer prepared by arranging at least one of a pattern unit comprising a geometrical pattern formed by use of a continuous metallic band, or comprising a multi-figured structure formed by combining a plurality of band-shaped metallic figures so as not to contact with each other; and an electromagnetic wave reflection-preventing method by use of the electromagnetic wave reflection-preventing material.

10 Claims, 5 Drawing Sheets

ELECTROMAGNETIC WAVE REFLECTION-PREVENTING MATERIAL AND ELECTROMAGNETIC WAVE REFLECTION-PREVENTING METHOD

BACKGROUND OF THE INVENTION (1) Field of the Invention

This invention relates to an electromagnetic wave reflection-preventing material and electromagnetic wave reflection-preventing method which make it possible to prevent interference due to electromagnetic wave and to be of a thin-gage film and weight-saved.

(2) Description of the Prior Art

For the purpose of avoiding a malfunction of an electronic equipment by an electromagnetic wave, there have been proposed in the art a process which comprises coating an electrically-conduction coating composition onto a housing of the electronic equipment, an process which comprises forming a thin film of a metal such as zinc, aluminum, iron and copper by plating, cladding, deposition, etc. onto a plastic substrate, and so forth. However, the above process coating the electrically-conductive coating composition onto the housing has such disadvantages that an electromagnetic wave shielding effect is poor and that the effect may be reduced with time. On the other hand, according to the above process forming the thin metal film onto the plastic substrate, the electromagnetic wave is reflected in such a large amounts that a secondary electromagnetic wave interference problem may be raised.

Japanese Patent Application Laid-open No.241098/90 discloses an electromagnetic wave-shielding film formed by drawing a geometrical pattern onto a film by use of an electrically-conductive metal, and shows that the electromagnetic wave-shielding film has good shielding properties. The above films proposed in the art may effectively function as a shielding material for preventing a leakage of the electromagnetic wave generated from the electronic equipment, or preventing a malfunction of the electronic equipment due to the electromagnetic wave from outside, but may not effectively function for preventing an electromagnetic wave interference such as a false image of a radar due to a reflection of the electromagnetic wave, for example, by a bridge, a building, etc., or the like.

For the purpose of preventing the above interferences due to the reflection of the electromagnetic wave, there are known electromagnetic wave absorbent materials which are prepared by dispersing ferrite or a mixture of ferrite with metal powder or carbon powder into an organic polymer.

However, for the purpose of achieving a practically available absorbing characteristics by use of the above materials, it is necessary for the above materials to have a weight of 4 kg/m$^2$ or move and a film thickness of 1 mm or more even in the case of an electromagnetic wave having a narrow band frequency with an effective band width of 0.5 to 1 GHz exclusive, or to have a weight of about 12 kg/m$^2$ or move and a film thickness of 2.5 mm or more in the case of an electromagnetic wave having a broad band frequency with an effective band width of 1 to 5 GHz. Therefore, in use, the above electromagnetic wave absorbent material has such disadvantages that it is so heavy in weight and so thick in film thickness as to show poor application and working properties, that in the case where it is applied to building structures, etc., it is necessary to take strength and balance of the building structure as a whole into consideration, and so forth. Thus, it has been of a great demand to develop an electromagnetic wave reflection-preventing material which is of a thin-gage film and weight-saved so as to show good application and working properties, and has improved electromagnetic wave shielding power and electromagnetic wave reflection-preventing power.

SUMMARY OF THE INVENTION

It is an object of the present invention to provide an electromagnetic wave reflection-preventing material and an electromagnetic wave reflection-preventing method, which are capable of shielding the electromagnetic wave and showing an highly improved electromagnetic wave reflection-preventing power.

The present invention provides an electromagnetic wave reflection-preventing material having a structure formed by successively laminating (A) an electromagnetic wave reflecting material layer; if needed, (B) a supporting layer; (C) a resin layer; if needed, (D) a supporting layer; and (E) a metallic pattern layer prepared by arranging at least one of a pattern unit comprising a geometrical pattern formed by use of a continuous metallic band, or comprising a multi-figured structure formed by combining a plurality of band-shaped metallic figures so as not to contact with each other.

The present invention also provides an electromagnetic wave reflection-preventing method which comprises applying the above electromagnetic wave reflection-preventing material onto a structure.

Further, the present invention provides an electromagnetic wave reflection-preventing method which comprises applying a laminate obtained by removing the electromagnetic wave reflecting material layer (A) from the above electromagnetic wave reflection-preventing material onto an electromagnetic wave reflecting structure having a metallic surface.

DETAILED DESCRIPTION OF THE INVENTION

Figure 1:
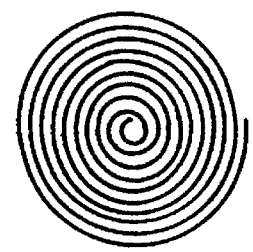
FIGS. 1–5 show examples of the pattern unit constituting the metallic pattern layer (E) of the electromagnetic wave reflection-preventing material in the present invention and comprising a geometrical pattern formed by use of a continuous metallic band.

The electromagnetic wave reflecting material layer (A) used in the electromagnetic wave reflection-preventing material of the present invention may include a metal layer which is capable of reflecting 100% to about 100%, i.e. about 99% or more of an incident electromagnetic wave, generally includes a metal sheet. The metal sheet may include a metal foil. Examples of the metal sheet may include sheets of metals such as tinplate, brass, duralumin, copper, iron, nickel, stainless sheet, aluminium and the like.

The film thickness of the metal sheet may not particularly be limited, but is preferably in the range of 5 to 500 μm from the standpoints of strength and weight-saving.

The supporting layer (B) laminated onto the electromagnetis wave reflecting material layer (A), if needed, may be used as a substrate when the resin layer (C) is formed by coating. The supporting layer (B) may not particularly be limited, but generally includes a plastic sheet having a film thickness of 10 to 500 μm. The plastic sheet may include a plastic film. Examples of the plastic sheet may include ones comprising resins such as polyamide, polyimide, polyester such as polyethylene terephathalate, polyvinyl chloride, polyvinylidene chloride, polyurethane, Hypalon (chlorosulfonated polyethylene, trade name) rubber, chlorinated rubber, chloroprene rubber, epoxy resin, acrylic resin, phenolic resin and the like. The above plastic sheet may include a fiber-reinforced plastic sheet.

The resin layer (C) (or a spacer layer) in the electromagnetic wave reflection-preventing material of the present invention is a layer placed between the electromagnetic wave reflecting material layer (A) or the supporting layer (B) and the supporting layer (D) or the metallic pattern layer (E). The resin layer may include resin sheets, and examples of the resins constituting the resin sheet may include polyimide, polyphenylene sulfide, rosin, shellac, ester rubber, Hypalon (chlorosulfonated polyethylene, trade name) rubber, chlorinated rubber, chloroprene rubber, polyolefin resin, hydrocarbon resin, vinylidene chloride resin, polyamide resin, polyether ketone resin, vinyl chloride resin, polyester resin, alkyd resin, phenolic resin, epoxy resin, acrylic resin, urethane resin, silicone resin, cellulose resin, vinyl acetate resin, and the like.

The resin layer may be a molded sheet formed by molding a dispersion prepared by dispersing powder of at least one selected from a group consisting of ferrite, carbon, metal powder and electrically conductive metallic oxide, and, if needed, a good dielectric material into the above resin or the resin solution. The resin layer (C) may also be a coated film formed by coating the above dispersion onto the electromagnetic wave reflecting material layer (A), the supporting layer (B) or the supporting layer (D), followed by drying. Further, the resin layer (C) may be a molded sheet obtained by coating the above dispersion onto paper, cloth, nonwoven fabric or porous sheet, followed by molding under pressure.

The thickness of the resin layer (C) may not particularly be limited, but normally in the range of about 50 μm to 3 mm, preferably 100 μm to 2 mm.

The ferrite to be dispersed into the resin or the resin solution may include ferrites conventionally used in the electromagnetic wave absorber, typically, for example, may include hematite ($Fe_2O_3$), magnetite ($Fe_3O_4$), iron oxides represented by the general formular: $MO.Fe_2O_3$ where M is Mn, Co, Ni, Cu, Zn, Ba, Mg, etc., and the like. The particle size of the ferrite may not particularly be limited, but preferably is 100 μm or less from the standpoints of dispersion properties, etc.

The carbon to be dispersed into the resin or the resin solution may preferably include carbons having an electrical conductivity, for example, electrically conductive carbon, carbon fiber, etc. A particle size of the carbon or a diameter of the carbon fiber may not particularly be limited, but preferably is 100 μm or less from the standpoints of dispersion properties, etc.

The metal powder to be dispersed into the resin or the resin solution may include, one comprising gold, platinum, silver, copper, nickel, aluminium, iron or the like.

The electrically conductive metallic oxide to be dispersed into the resin or the resin solution may include metallic oxides having electric conductivity, for example, tin oxide and indium oxide.

The above metal powder and metallic oxide may be in the form of a particle or fiber, or may be in such a form that it may be formed as a thin film by deposition or the like onto a polymer powder or inorganic powder having the shape of a particle or fiber. A particle size of the particle or a diameter of the fiber may not particularly be limited, but may preferably be 100 μm or less from the standpoints of dispersion properties, etc.

The good dielectric material to be incorporated, if needed, in the resin or the resin solution may include, for example, titanates compounds such as barium titanate, strontium titanate, zirconium titanate, potassium titanate and the like in the form of a particle, whisker, etc., silicon carbide, silicon nitride, and the like. The above good dielectric material may be in the form of a particle or a fiber. A particle size of the particle or a diameter may not particularly be limited, but may preferably be 100 μm or less from the standpoints of dispersion properties, etc.

The powder of at least one selected from the ferrite, carbon, metal powder and electrically conductive metallic oxide may be used alone or in combination to be incorporated and dispersed into the resin or the resin solution. If needed, a good dielectric material may be incorporated into the above powder to be dispersed.

The amount of the above powder used per 100 parts by weight of the binder may preferably be in the following ranges respectively.

When the ferrite used alone, in the range of 100 to 200 parts by weight.

When at least one of carbon, metal powder and electrically conductive metallic oxide used, in the range of 3 to 20 parts by weight.

When the mixture of ferrite with at least one of carbon, metal powder and electrically conductive metallic oxide, used, in the range of 3 to 200 parts by weight in total, a total amount of carbon, metal powder and electrically conductive metallic oxide being less than 20 parts by weight.

When the mixture of ferrite and good dielectric material used, in the range of 100 to 200 parts by weight in total, an amount of the good dielectric material being less than 50% by weight based on a total amount of the powder.

When the mixture of at least one of carbon, metal powder and electrically conductive metallic oxide with the good dielectric material used, in the range of 3 to 200 parts by weight in total, a total amount of carbon, metal powder and electrically conductive metallic oxide being less than 20 parts by weight.

When the mixture of ferrite, at least one of carbon, metal powder and electrically conductive metallic oxide, and the good dielectric material used, in the range of 3 to 200 parts by weight in total, a total amount of carbon, metal powder and electrically conductive metallic oxide being less than 20 parts by weight, an amount of the good dielectric material being preferably less than 50% by weight based on a total amount of the powder.

On dispersing the above powder into the resin or resin solution, dispersion of the resin powder and the above powder by kneading may be carried out under heating, or may be carried out by the known process, for example, by incorporating, if needed, a solvent to dissolve or disperse the resin, followed by kneading, stirring or the like to disperse the above powder. Into the above dispersion may be incorporated a curing agent such as aminoplast, polyisocyanate, or the like.

When a resin layer (C) is a molded sheet obtained by coating the above dispersion onto a substrate such as paper, cloth, nonwoven fabric or porous sheet, followed by molding under pressure, the substrate may not particularly be limited so long as it has a void and may be impregnated with the dispersion during coating and molding steps, preferably has a void content of 20 to 95%. Typical examples of the substrate may include cellulose based paper; cloth and nonwoven fabric obtained from fibers for example, synthetic fibers such as nylon fiber, polyester fiber, acrylic fiber, polyimide fiber and the like, carbon fiber, ceramic fibers such as titanate whisker, silicon carbide fiber and the like, natural fibers such as cotton yarn, flax, wool and the like; porous sheets such as a porous sintered material sheet comprising a ceramics obtained by sintering a mixture of an organic polymer with a ceramics, a foamed plastic sheet and the like; and the like. A thickness of the above substrate such as paper, cloth, nonwoven fabric and porous sheet may not particularly be limited, but normally in the range of about 50 μm to about 3 mm.

In the above coating and the molding under pressure, the above dispersion or a coating composition is coated onto the above substrate, followed by removing the solvent, if needed, by heating and molding under pressure to obtain the resin layer (C). If needed, the molding may be carried out under heating, the above molding also results in impregnation of the substrate with the dispersion or the coating composition. In the case where the binder in the dispersion or the coating composition is thermosetting, the molding by heating under pressure may preferably be carried out at the so-called B stage.

The pressure of the molding may vary depending on a kind of the binder used and properties of the substrate, but generally is in the range of 20 to 500 kg/cm$^2$. The optional heating condition on molding may normally be in the range of room temperature to 250°. A pressing time is normally in the range of one minute to 120 minutes. An impregnation percentage of the coating composition for the substrate to be occupied by the solid content of the coating composition is preferably 20 to 95% by volume based on the volume of the substrate including the void. The coating composition may be coated onto the substrate in such a coating weight that the thickness of the resin layer (C) may be normally about 50 μm to 3 mm, preferably 100 μm to 2 mm.

Regarding to the electromagnetic wave reflection-preventing material of the present invention, the function and effect of the resin layer (C) are not cleared, but it is considered that the resin layer (C) may function to vary a traveling path length of an electromagnetic wave which has entered inside through a metal-free area of the metallic pattern layer (E) and to vary a phase of an electromagnetic wave which reflects on the layer (A) and leaves through the metal-free area of the metallic pattern layer (E) outside, and that an interference between an electromagnetic wave reflected on the metal area of the metallic pattern layer (E) and the above electromagnetic wave having been varied in phase provides an effect to disappear energy of the electromagnetic wave.

According to the electromagnetic wave reflection-preventing material of the present invention, a metallic pattern layer (E) is laminated directly or through a supporting layer (D) onto the resin layer (C).

The above supporting layer (D) may be used, if needed, as a substrate on forming the metallic pattern layer (E) or the resin layer (C). The supporting layer (D) may include ones used in the supporting layer (B) in the same manner as in the supporting layer (B).

The above metallic pattern layer (E) may be formed directly onto the resin layer (C), or may be formed onto the supporting layer (D), followed by adhering the layer (D) of the resulting laminate onto the resin layer (C).

The pattern of the metallic pattern layer (E) may be formed by the known processes such as an etching process which comprises etching a metal foil or a metal sheet to form a pattern, a pattern plating process, a decalcomania process, and the like.

The etching process may include, for example, a process which comprises adhering a metal foil or a metal sheet onto the supporting layer (D), subjecting the metal foil or the metal sheet to a photoresist process or a printing process to form an etching resist layer, and etching away an exposed metal area not forming a resist layer.

The decalcomania process may include, for example, a process which comprises forming a metallic pattern onto a substrate for use in decalcomania transferring, and transferring the metallic pattern onto the supporting layer (D) or the resin layer (C).

The pattern plating process may include, for example, a process which comprises subjecting the resin layer (C) or the supporting layer (D) coated respectively with a plating catalyst such as platinum chloride to a photoresist process or an printing process to form a resist layer having a pattern, followed by subjecting to an electroless plating process to deposit metal in such an area only as not to be covered with a resist; a process which comprises subjecting the layer (D) or the layer (C) to an electroless plating process to form a thin plating layer, subjecting the plating layer to a photoresist process or a printing process to form a resist layer having a pattern, followed by subjecting to an electrolytic plating to carry out plating in a necessary thickness in such a plated area as not to be covered with a resist, removing the resist, and etching away the thin plating layer formed by the electroless plating process; and the like.

On forming the metallic pattern layer (E) onto the supporting layer (D), the supporting layer (D) may be adhered onto the resin layer (C) by use of an adhesive, followed by forming the metallic pattern layer (E) thereon, or the metallic pattern layer (E) may be formed onto the supporting layer (D) itself, followed by adhering the supporting layer (D) of the resulting laminate onto the resin layer (C).

Examples of the metal constituting the metallic pattern layer (E) may include platinum, gold, silver, nickel, chromium, aluminium, copper, iron and the like. The thickness of the metal of the metallic pattern layer may preferably be in the range of 0.5 to 50 μm from the standpoints of strength, weight, etc.

The pattern of the metallic pattern layer (E) may be such that the metallic pattern layer (E) may be prepared by arranging at least one of a pattern unit comprising a geometrical pattern formed by use of a continuous metallic band, or comprising a multi-figured structure formed by combining a plurality of band-shaped metallic figures so as not to contact with each other.

Examples of the pattern unit comprising the geometrical pattern formed by use of the continuous metallic band may include spiral figures as shown in FIGS. 1–5.

In the geometrical pattern as the pattern unit formed by use of the continuous metallic band, the space in the geometrical pattern, for example, in a spiral pattern, a space between inner band and outer band neibouring the inner band, is preferably in the range of 0.01 to 10 mm, more preferably 0.05 to 5 mm. The space may be at regular intervales or at irregular intervals, but regular intervals are peferred from the standpoint of the electromagnetic wave reflection-preventing power.

Examples of the pattern unit comprising the multi-figured structure formed by combining a plurality of band-shaped metallic figures so as not to contact with each other may include ones shown in FIGS. 7–17, for example, planar multi-figured structures obtained by arranging respective figures so as to form a multi-figured structure, for example, forming the stripe pattern, concentrically arranging circles different in size from each other, concentrically arranging analogous polygons different in size from each other, and the like.

A space between bands of adjacent figures in the pattern unit as the multi-figured structure is preferably in the range of 0.01 to 10 mm, more preferably 0.05 mm to 5 mm. The spaces may be at regular intervals or at irregular intervals. Respective figures may or may not be in the analogous shape, but the above range of the space between bands in the pattern unit is preferred from the standpoint of the electromagnetic wave reflection-preventing power. A combination of figures in the analogous shape makes it easy to keep the above space within a predetermined range. Respective figures may be a closed ring-shaped figure having no open end or an open ring-shaped figure having an open end.

Each band-shaped metallic figure constituting the pattern unit is not particularly limited in shape so long as it is band-shaped, but preferably has a width of 0.01 to 5 mm and a ratio of a mean value of its length to a mean value of its width in the range os 3:1 to $10^{6:1}$. The size of the pattern unit may preferably be such that a longest linear distance between arbitrarily selected two points on the metallic pattern in one pattern unit is 300 mm or less.

Figure 13:
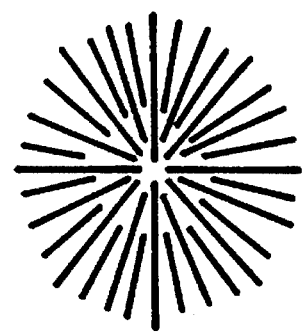
Figure 14:
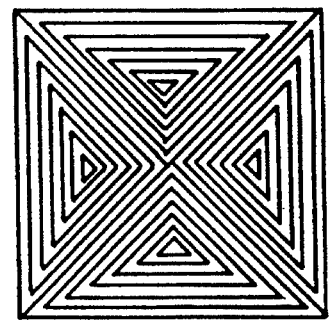
Figure 15:
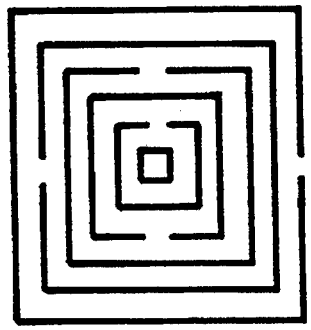
Figure 16:
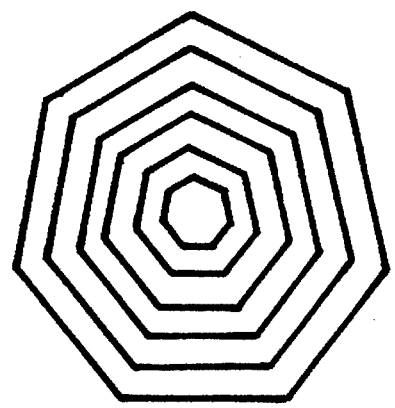
Figure 17:
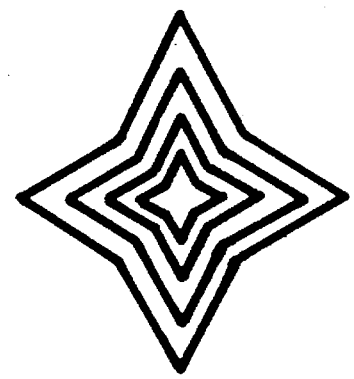

The pattern unit is not limited to ones having shapes and sizes shown in the above drawings. For example, in FIG. 7, a number of figures to be combined so as to form the pattern unit may arbitrarily be changed depending on the size of the pattern unit, width of the band, space between bands, etc. In FIG. 13, a number of a segment or band used in a segment pattern unit may arbitrarily be changed.

Figure 6:
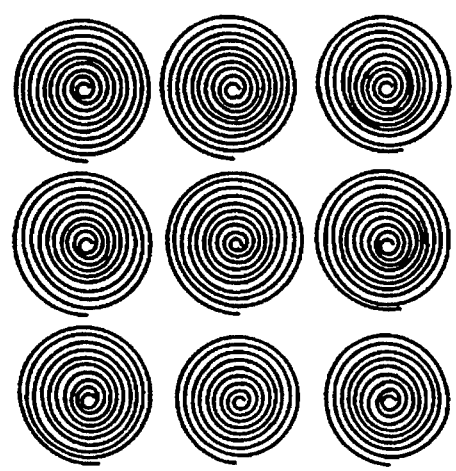
FIGS. 6 and 18 show examples of the arrangement of the pattern unit constituting the metallic pattern layer (E) of the electromagnetic wave reflection-preventing material in the present invention.
Figure 18:
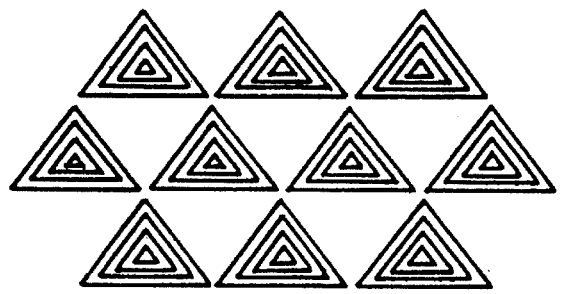

The pattern of the metallic pattern layer (E) in the present invention may comprise one pattern unit or may comprise ones formed by arranging a plurality of pattern units, for example, in lattice pattern, checkered pattern, stripe pattern, etc. as shown in FIGS. 6 and 18. The arrangement of the pattern unit may preferably be made in the form of a predetermined repeating pattern. A ratio of a metal-free area to a metal area on the surface when the metallic pattern layer (E) formed may preferably be 0.05 to 20, more preferably 0.1 to 10, most preferably 0.2 to 5.

The electromagnetic wave reflection-preventing material of the present invention may be prepared by successively laminating the electromagnetic wave reflecting material layer (A), if needed, the supporting layer (B), the resin layer (C), if needed, the supporting layer (D) and the metallic pattern layer (E).

For the purpose of the improvement of the electromagnetic wave reflection-preventing material in corrosion resistance, weather resistance, appearance, maintenance of material characteristics, etc., a clear or colored coating layer may be laminated onto the metallic pattern layer (E). Examples of the resin constituting the coating layer may include epoxy resin, urethane resin, acrylic resin, polyester resin, and the like.

The electromagnetic wave reflection-preventing method of the present invention comprises applying the electromagnetic wave reflection-preventing material of the present invention onto a structure to shied electromagnetic wave and to prevent reflection of electromagnetic wave by adhering the electromagnetic wave reflection-preventing material onto the structure by use of an adhesive or the like, and makes it possible to effectively shield electromagnetic wave and prevent reflection of electromagnetic wave.

In the case where the above structure to shield electromagnetic wave and to prevent reflection of electromagnetic wave is an electromagnetic wave reflecting structure having a metallic surface, the electromagnetic wave reflecting structure may function like the electromagnetic wave reflecting material layer (A) of the present invention to shield electromagnetic wave and so forth. In the above case, another embodiment of the electromagnetic wave reflection-preventing method of the present invention comprises applying a laminate obtained by removing the electromagnetic wave reflecting material layer (A) from the electromagnetic wave reflection-preventing material onto the electromagnetic wave reflecting structure having the metallic surface, and makes it possible to effectively prevent reflection of electromagnetic wave.

An adhering agent may be coated beforehand on the surface of the electromagnetic wave reflecting metallic material layer (A) of the electromagnetic wave reflection-preventing material of the present invention, a release sheet may be laminated thereon, and the release sheet may then be separated for simply adhering to the structure in situ to form an electromagnetic wave reflection-preventing material onto the structure.

As evident from the results of Examples 1–4, and 6–11, the electromagnetic wave reflection-preventing material of the present invention shows extremely low electromagnetic wave reflectances in spite of being thin in thickness and light in weight, and shows a wide effective absorption area. As evident from the results of Comparative Examples 1 and 3, lack of electromagnetic wave reflecting material layer (A) of the present invention shows a very high electromagnetic wave reflectance and provides little effect of absorbing electromagnetic wave. As evident from the results of Comparative Examples 2 and 4, use of substantially only the ferrite-containing resin layer makes it necessary to use a thick laminate so that a low electromagnetic wave reflectance may be obtained, and shows a narrow effective absorption area.

It is considered from the above results that the electromagnetic wave reflection-preventing material provides excellent electromagnetic wave reflection-preventing effect as the results of mutual, unexpected, special wave interference or wave energy negation with one another due to a combination of the metallic pattern layer (E), the resin layer (C) and the electromagnetic wave reflecting material layer (A).

The results of Examples 5 and 12 as the examples of the electromagnetic wave reflection-preventing method comprising applying a laminate obtained by removing the electromagnetic wave reflecting material layer (A) from the electromagnetic wave reflection-preventing material onto an electromagnetic wave reflecting structure having a metallic surface show excellent electromagnetic wave reflection-preventing effect.

The present invention will be explained more in detail by the following Examples and Comparative Examples, in which "part" means "part by weight".

EXAMPLE 1

Onto a nonwoven fabric consisting of an aramid fiber and having a thickness of 100 μm was coated a coating composition containing 200 parts of a nickel based ferrite per 105 parts of a mixture of 100 parts of Epikote 828 with 5 parts of diethylenetetramine as a currring agent so that a dry film thickness may be 300 μm when coated onto a smooth metallic surface, followed by leaving to stand at room temperature for 20 minutes, heating at 100° for 20 minutes under a pressure of 40 kg/cm$^2$ and heating and molding at 130° for 20 minutes to obtain a resin layer (C).

Separately, onto a polyimide film layer (D) having a thickness of 50 μm was laminated a copper foil having a thickness of 18 μm, followed by coating thereonto a negative type photoresist SONNE EDUV 376 (marketed by Kansai Paint Co., Ltd.) to a film thickness of about 20 μm by the electrodeposition coating process, exposing to light in a dose of 100 mj/cm$^2$ by an ultrahigh mercury lamp through a negative type photomask having a pattern formed by arranging a pattern unit comprising such a spiral pattern that a diameter of an outermost circular arc is about 5 mm, that a line width of the band is about 100 μm and that a line space between circular arcs of the band is about 100 μm as shown in FIG. 1, in such a lattice pattern that a minimum distance between pattern units may be 0.2 mm as shown in FIG. 6, developing with a 1% aqueous sodium carbonate solution, and removing a exposed copper with ferric chloride to obtain a copper pattern layer (E).

An aluminium foil layer (A) having a thickness of 50 μm was adhered onto the above layer (C), and the above layer (C) was adhered onto the layer (D) constituting a laminate comprising the layer (D) and the layer (E) respectively by use of an adhesive to obtain an electromagnetic wave reflection-preventing material.

EXAMPLE 2

Figure 2:
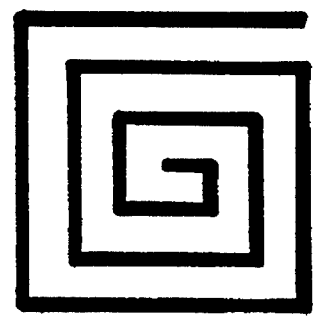

Onto a polyimide film layer (D) was formed a copper pattern layer (E) in the same manner as in Example 1 except for using a negative type photomask having a pattern formed by arranging a pattern unit comprising such a spiral pattern that a longest side length is about 6 mm, that a line width of the band is about 200 μm a space between sides is about 250 μm as shown in FIG. 2.

An aluminium foil layer (A) having a thickness of 50 μm was adhered onto a polyethylene terephatharate sheet layer (C) having a thickness of 500 μm, and the above layer (C) was adhered onto the layer (D) constituting a laminate comprising the layer (D) and the layer (E) respectively by use of an adhesive to obtain an electromagnetic wave reflection-preventing material.

EXAMPLE 3

A coating composition containing 200 parts of barium based ferrite, 5 parts of electrically conductive carbon and 70 parts of barium titanate, per 100 parts of an acrylic resin, was coated to be a dry film thickness of 300 μm onto a polyethylene film layer (B) having a thickness of 100 μm, followed by heating at 80° for 60 minutes to form a layer (C).

Figure 3:
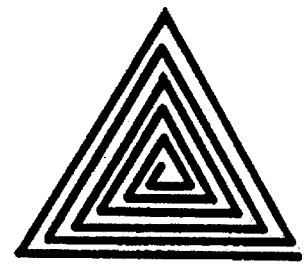
Figure 4:
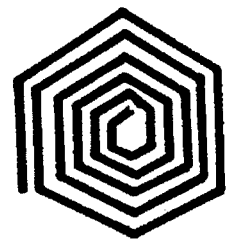
Figure 5:
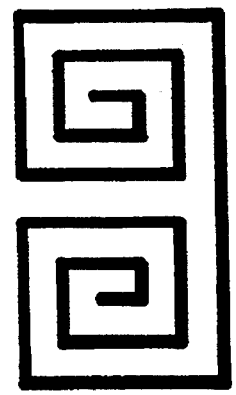

Separately, onto a polyimide film layer (D) was formed a copper pattern layer (E) in the same manner as in Example 1 except for using a negative type photomask having a pattern formed by arranging a pattern unit comprising such a spiral pattern that a longest side length of a triangle is about 10 mm, that a band width is about 150 μm and that a space between sides is about 200 μm as shown in FIG. 3, in such a lattice pattern that a minimum distance between pattern units upward and downward as well as from side to side respectively may be about 3 mm, as like to FIG. 18.

An aluminium foil layer (A) having a thickness of 50 μm was adhered onto the layer (B) constituting a laminate comprising the layer (B) and the layer (C), and the layer (C) was adhered onto the layer (D) constituting a laminate comprising the layer (D) and the layer (E) respectively by use of an adhesive to obtain an electromagnetic wave reflection-preventing material.

EXAMPLE 4

The experiments of Example 1 were repeated except that a potassium titanate whisker nonwoven fabric having a thickness of 250 μm was used in place of the aramid fiber nonwoven fabric having a thickness of 100 μm to obtain an electromagnetic wave reflection-preventing material.

EXAMPLE 5

The experiments of Example 3 were repeated to obtain an electromagnetic wave reflection-preventing structure except that a steel pole of 300 mm×300 mm× 1000 mm as a structure having a metallic surface was used in place of the aluminium foil layer (A) in Example 3, and that an urethane clear coating layer was further formed onto the pattern layer (E).

COMPARATIVE EXAMPLE 1

A laminate remaining after removing the layer (A) from the electromagnetic wave reflection-preventing material in Example 3 was used as Comparative Example 1.

COMPARATIVE EXAMPLE 2

Onto a polyimide film layer (B) having a thickness of 50 μm was coated and dried a coating composition containing 300 parts of barium based ferrite per 100 parts of acrylic resin to be a dry film thickness of 3 mm to obtain a laminate consisting of the above layer (B) and the ferrite-containing resin layer formed thereon as Comparative Example 2.

EXAMPLE 6

A coating composition containing 300 parts of barium based ferrite per 100 parts of acrylic resin was coated to be a dry film thickness of 200 μm onto a polyimide film layer (B) having a thickness of 50 μm to form a resin layer (C).

Figure 7:
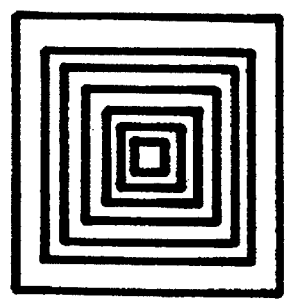
FIGS. 7–17 show examples of the pattern unit constituting the metallic pattern layer (E) of the electromagnetic wave reflection-preventing material in the present invention and comprising a multi-figured structure formed by combining a plurality of band-shaped metallic figures so as not to contact with each other.
Figure 8:
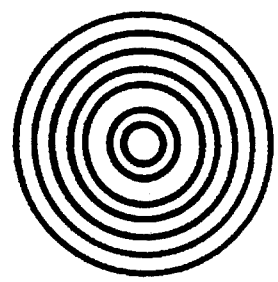
Figure 9:
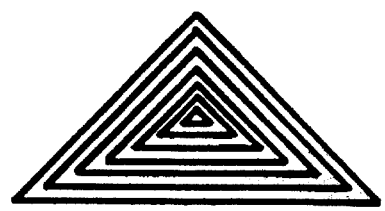
Figure 10:
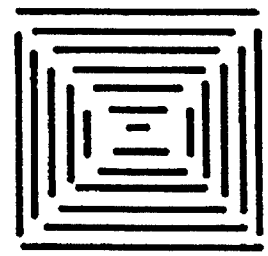
Figure 11:
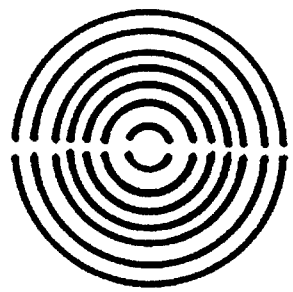
Figure 12:

Separately, onto a polyimide film layer (D) having a thickness of 50 μm was laminated a copper foil having a thickness of 18 μm, followed by coating thereonto a negative type photoresist SONNE EDUV 376 (marketed by Kansai Paint Co., Ltd.) to a film thickness of about 20 μm by the electrodeposition coating process, exposing to light in a dose of 100 mj/cm$^2$ by an ultrahigh mercury lamp through a negative type photomask having a pattern formed by arranging a pattern unit comprising such a spiral pattern that an outermost side length is about 12 mm, that a line width of the band is about 200 μm and that a line space between the bands is about 100 μm as shown in FIG. 7, in a checkered pattern, developing with a 1% aqueous sodium carbonate solution, and removing a exposed copper with ferric chloride to obtain a metallic pattern layer (E). A thermocompression bonding sheet was inserted between an aluminium foil layer (A) having a thickness of 50 μm and the above layer (B) as well as between the above layer (C) and the above layer (D) respectively, followed by pressing while heating at 180° to obtain an electromagnetic wave reflection-preventing material.

EXAMPLE 7

A coating composition containing 150 parts of nickel based ferrite per 105 parts of a mixture of 100 parts of Epikote 828 (bisphenol A type epoxy resin, marketed by Shell Chemical Co., Ltd.) with 5 parts of diethylenetetramine as a curing agent was coated to be a dry film thickness of 500 μm onto an aluminium foil layer (A) having a thickness of 50 μm to form a resin layer (C). Onto the layer (C) was formed an aluminium pattern layer (E) having a thickness of 25 μm and prepared by arranging such a pattern unit shown in FIG. 10 and that an outermost band length is about 10 mm, that a line width is 100 μm and that a space between bands is 100 μm, in such a lattice pattern that a space between pattern units upward and downward as well as from side to side may be 3 mm respectively, by a decalcomania process to obtain an electromagnetic wave reflection-preventing material.

EXAMPLE 8

Six sheets of polyethylene terephthalate film having a thickness of 150 μm were laminated and adhered with each other to form a resin layer (C). Separately, onto a polyimide film layer (D) having a thickness of 50 μm was adhered a copper foil having a thickness of 18 μm, followed by subjecting to an etching process by use of the same electrodeposition resist as in Example 6 to form such a copper pattern layer (E) that a pattern unit shown in FIG. 13 and having a longest band length of 20 mm and a line width of 1 mm may be arranged so that a space between pattern units upward and downward as well as from side to side may be 3 mm respectively. Further, onto the layer (E) was formed a two-pack urethane clear coating layer having a dry film thickness of 50 μm.

Onto an aluminium foil layer (A) having a thickness of 50 μm was adhered the resulting resin layer (C) by use of an adhesive, followed by adhering the layer (C) onto the layer (D) constituting a laminate comprising the layer (D), the layer (E) and the clear coating layer by use of an adhesive to obtain an electromagnetic wave reflection-preventing material.

EXAMPLE 9

Onto a polyimide nonwoven fabric having a thickness of about 120 μm was coated a coating composition containing 5 parts of nickel powder, and 70 parts of barium titanate per 100 parts of acrylic resin so that a dry film thickness may be 800 μm when coated onto a smooth metallic surface, followed by heating, pressing and molding at 140° under a pressure of 200 kg/cm² for 60 minutes to form a resin layer (C). Separately, onto a polyimide film layer (D) having a thickness of 50 μm was adhered a copper foil having a thickness of 18 μm, followed by subjecting to an etching process by use of the same electrodeposition resist as in Example 6 to form such a copper pattern layer (E) that a pattern unit shown in FIG. 9 and having an outermost and longest side length of about 8 mm, a line width of 200 μm and a space of 100 μm may be arranged so that a distance between apexes among respective pattern units may 0.5 mm as shown in FIG. 18.

An aluminium foil layer (A) having a thickness of 50 μm was adhered onto the resulting layer (C), and the layer (C) was adhered onto the layer (D) having the pattern layer (E) by use of an adhesive respectively to obtain an electromagnetic wave reflection-preventing material.

EXAMPLE 10

A coating composition containing 175 parts of barium based ferrite and 25 parts of potassium titanate whisker per 100 parts of acrylic resin was coated to be a dry film thickness of 350 μm onto a polyimide film layer (B) having a thickness of 50 μm to form a resin layer (C). Separately, onto a glass epoxy resin substrate layer (D) having a thickness of 120 μm was adhered a copper foil having a thickness of 18 μm, followed by subjecting to an etching process by use of the same electrodeposition resist as in Example 6 to form such a copper pattern layer (E) that the same pattern unit as in Example 6, and the pattern unit shown in FIG. 8 and having an inner diameter of about 12 mm for an outermost circle, an inner diameter of about 0.5 mm for an innermost circle, a line width of 300 μm and a space of 200 μm are alternately arranged so that a minimum space of an outermost periphery may be 2 mm.

An aluminium foil layer (A) having a thickness of 50 μm was adhered onto the resulting layer (C), and the layer (C) was adhered onto the layer (D) having the pattern layer (E) by use of an adhesive respectively to obtain an electromagnetic wave reflection-preventing material.

EXAMPLE 11

Onto a polyimide film having a thickness of about 50 μm was coated and dried a coating composition containing 150 parts of a barium based ferrite, 15 parts of powders prepared by coating barium salfate powder with an indium-tin oxide to a thickness of about 100 nm by spattering, and 50 parts of strontium titanate powder per 100 parts of acrylic resin so that a dry film thickness may be 100 μm. Onto the layer (C) was adhered an aluminium foil having a thickness of 25 μm, followed by subjecting to an etching process by use of the same electrodeposition resist as in Example 6 to form such an aluminium pattern layer (E) that a pattern unit shown in FIG. 17 and having a distance between adjacent apexes for an outermost periphery of 10 mm, a line width of 300 μm and a space of 200 μm may be arranged a minimum distance of four apexes of an acute angles of the outermost periphery between pattern units may be 0.5 mm in a checkered pattern.

A duralumin foil layer (A) having a thickness of 50 μm was adhered onto the layer (C) having the resulting pattern layer (E) by use of an adhesive to obtain an electromagnetic wave reflection-preventing material.

EXAMPLE 12

The experiments of Example 1 were repeated except that a steel pole of 300 mm×300 mm×1000 mm as a structure having a metallic surface was used in place of the aluminium foil layer (A), and further an urethane clear coating layer having a thickness of 50 μm was formed onto the pattern layer (E).

COMPARATIVE EXAMPLE 3

A laminate remaining after removing the layer (A) from the electromagnetic wave reflection-preventing material in Example 7 was used as Comparative Example 3.

COMPARATIVE EXAMPLE 4

Onto a polyimide film layer having a thickness of 50 μm was coated and dried a coating composition containing 200 parts of barium based ferrite per 100 parts of acrylic resin to be a dry film thickness of 3 mm to obtain a laminate consisting of the polyimide film layer and the ferrite-containing resin layer formed thereon as Comparative Example 2.

The electromagnetic wave reflection-preventing materials in Examples 1–4, and 6–11, the electromagnetic wave reflection-preventing structures in Examples 5 and 12, and the laminates in Comparative Examples 1–4 were subjected to measurements of the electromagnetic wave reflection-preventing effect by the following method. The results are shown in the following Tables 1 and 2. The weights of the electromagnetic wave reflection-preventing materials in Examples 1–4, and 6–11, the laminates of Comparative Examples 1–4, are shown in Tables 1 and 2. Regarding to Examples 5 and 12, the weight of the laminate adhered onto the steel pole, excepting for the steel pole itself, is shown in Tables 1 and 2.

Method of Measuring the Electromagnetic Wave Reflection-Preventing Effect

A transmitting horn antenna and a receiving horn antenna was set within a microwave dark room, onto the wall of which was adhered an electromagnetic wave absorber having an electromagnetic wave reflectance of 0.01% or less, so that an angle between an incident electromagnetic wave and reflected electromagnetic wave may be 5°, and a metallic reflecting plate was placed at a distance of 50 cm from respective antennas thereafter, reflected signals are received by the receiving horn antenna to measure the resulting electromagnetic wave reflectance to be 100%. Next, a measuring sample was placed in place of the metallic reflecting plate to measure a maximum absorption frequency, an electromagnetic wave reflectance at the maximum absorption frequency, and an effective absorption frequency range, which is a frequency range to show an electromagnetic wave reflectance of 1% or less around the maximum absorption frequency, from signals reflected from the surface of the measuring sample over varied frequencies.

TABLE 1

| Example | Maximum absorption frequency ($GH_z$) | Electromagnetic wave reflectance (%) | Effective absorption frequency area ($GH_z$) | Weight (kg/m$^2$) | Thickness (mm) |
| --- | --- | --- | --- | --- | --- |
| Example 1 | 9.6 | 0.1 | 5.8~12.8 | 1.1 | 0.45 |
| Example 2 | 11.2 | 0.3 | 9.8~12.9 | 0.85 | 0.62 |
| Example 3 | 9.1 | 0.1 | 6.6~12.6 | 1.15 | 0.52 |
| Example 4 | 10.1 | 0.05 | 6.8~13.4 | 1.15 | 0.50 |
| Example 5 | 9.1 | 0.1 | 6.7~12.4 | 1.10 | 0.52 |
| Comp. Ex. 1 | 12.7 | 65.8 | — | 1.05 | 0.47 |
| Comp. Ex. 2 | 11.2 | 0.9 | 10.5~11.6 | 8.7 | 3.05 |

TABLE 2

| Example | Maximum absorption frequency ($GH_z$) | Electromagnetic wave reflectance (%) | Effective absorption frequency area ($GH_z$) | Weight (kg/m$^2$) | Thickness (mm) |
| --- | --- | --- | --- | --- | --- |
| Example 6 | 10.1 | 0.2 | 8.4~11.7 | 1.3 | 0.59 |
| Example 7 | 12.7 | 0.3 | 11.1~14.3 | 1.2 | 0.57 |
| Example 8 | 7.1 | 0.3 | 6.2~8.0 | 1.1 | 1.07 |
| Example 9 | 9.3 | 0.1 | 7.8~10.8 | 1.5 | 0.88 |
| Example 10 | 11.3 | 0.05 | 9.8~12.8 | 1.2 | 0.57 |
| Example 11 | 7.3 | 0.1 | 6.1~8.5 | 1.1 | 0.53 |
| Example 12 | 10.2 | 0.2 | 8.5~11.6 | 1.2 | 0.54 |
| Comp. Ex. 3 | 12.7 | 67.3 | — | 1.2 | 0.52 |
| Comp. Ex. 4 | 11.2 | 1.2 | 10.6~11.7 | 8.1 | 3.05 |

What is claimed is:

1. An electromagnetic wave reflection-preventing material having a structure formed by successively laminating (A) an electromagnetic wave reflecting material layer, (B) a supporting layer, (R) a resin layer, (D) a supporting layer, and (E) a metallic pattern layer which has been prepared by arranging at least one pattern unit comprising a geometrical pattern formed by use of a continuous metallic band, or comprising a multi-figured structure formed by combining a plurality of band-shaped metallic figures so as not to contact with each other.

2. An electromagnetic wave reflection-preventing material having a structure formed by successively laminating (A) an electromagnetic wave reflecting material layer, (B) a supporting layer, (R) a resin layer, and (E) a metallic pattern layer which has been prepared by arranging at least one pattern unit comprising a geometrical pattern formed by use of a continuous metallic band, or comprising a multi-figured structure formed by combining a plurality of band-shaped metallic figures so as not to contact with each other.

3. An electromagnetic wave reflection-preventing material having a structure formed by successively laminating (A) an electromagnetic wave reflecting material layer, (R) a resin layer, (D) a supporting layer, and (E) a metallic pattern layer which has been prepared by arranging at least one pattern unit comprising a geometrical pattern formed by use of a continuous metallic band, or comprising a multi-figured structure formed by combining a plurality of band-shaped metallic figures so as not to contact with each other.

4. An electromagnetic wave reflection-preventing material having a structure formed by successively laminating (A) an electomagnetic wave reflecting material layer, (R) a resin layer, and (E) a metallic pattern layer which has been prepared by arranging at least one pattern unit comprising a geometrical pattern formed by use of a continuous metallic band, or comprising a multi-figured structure formed by combining a plurality of band-shaped metallic figures so as not to contact with each other.

5. The electromagnetic wave reflection-preventing material as claimed in claim 1, 2, 3 or 4, wherein said resin layer (R) contains powder which is at least one member selected from the group consisting of ferrite powder, carbon powder, metal powder and electrically conductive metallic oxide powder, or a mixture of said powder and a good dielectric material selected from the group consisting of titanate compound, silicon carbide and silicon nitride, which has been dispersed into said resin, and said resin layer (R) has a thickness in the range of 50 μm to 50 mm.

6. The electromagnetic wave reflection-preventing material as claimed in claim 1, 2, 3 or 4, wherein said resin layer (R) is formed by coating a coating composition prepared by dispersing powder which is at least one member selected from the group consisting of ferrite powder, carbon powder, metal powder and electrically conductive metallic oxide powder, or a mixture of said powder and a good dielectric material selected from the group consisting of titanate compound, silicon carbide and silicon nitride, into the above resin, onto a member selected from the group consisting of paper, cloth, nonwoven fabric and porous sheet, followed by molding under pressure, and said resin layer (R) has a thickness in the range of 50 μm to 50 mm.

7. The electromagnetic wave reflection-preventing material as claimed in claim 1, 2, 3 or 4, wherein said resin layer (R) is a molded sheet formed by molding a dispersion prepared by dispersing powder which is at least one member selected from the group consisting of ferrite powder, carbon powder, metal powder and electrically conductive metallic oxide powder, or a mixture of said powder and a good dielectric material selected from the group consisting of titanate compound, silicon carbide and silicon nitride, into the above resin or the resin solution, or is a coated film formed by coating said dispersion onto either the electromagnetic wave reflecting material layer (A), the supporting layer (B) or the supporting layer (D), followed by drying, and said resin layer (R) has a thickness in the range of 50 μm to 50 mm.

8. The electromagnetic wave reflection-preventing material as claimed in claim 1, 2, 3 or 4, wherein the metallic pattern layer (E) comprises a metallic pattern which has been prepared by a process which comprises forming an etching resist layer by a photoresist process or a printing process onto a metal foil or a metal sheet respectively having been adhered onto the supporting layer (D), and etching away an exposed metal without forming a resist layer thereon, the metal constituting the metallic pattern layer (E) is a metal selected from the group consisting of platinum, gold, silver, nickel, chromium, aluminum, copper and iron, and the metallic pattern layer (E) has a thickness in the range of 0.5 to 50 μm.

9. The electromagnetic wave reflection-preventing material as claimed in claim 1, 2, 3 or 4, wherein each band-shaped metallic figure constituting the pattern unit is a figure in a geometrical shape formed by a metallic band having a width of 0.01 to 5 mm and a ratio of a mean value in length to a mean value in width in the range of 3:1 to $10^6$:1, the pattern unit has a size such that a longest linear distance between arbitrarily selected two points on the metallic pattern in one pattern unit is 300 mm or less, and ratio of metal-free area to metal area on the surface of the metallic pattern layer (E) is 0.05 to 20.

10. The electromagnetic wave reflection-preventing material as claimed in claim 1, 2, 3 or 4, wherein a clear or colored coating layer is further formed onto the uppermost metallic pattern layer (E) of the electromagnetic wave reflection-preventing material.

* * * * *